SEMICONDUCTOR DEVICE DOPED WITH GOLD JUST TO THE POINT OF NO EXCESS AND METHOD OF MAKING
Filed Oct. 24, 1966
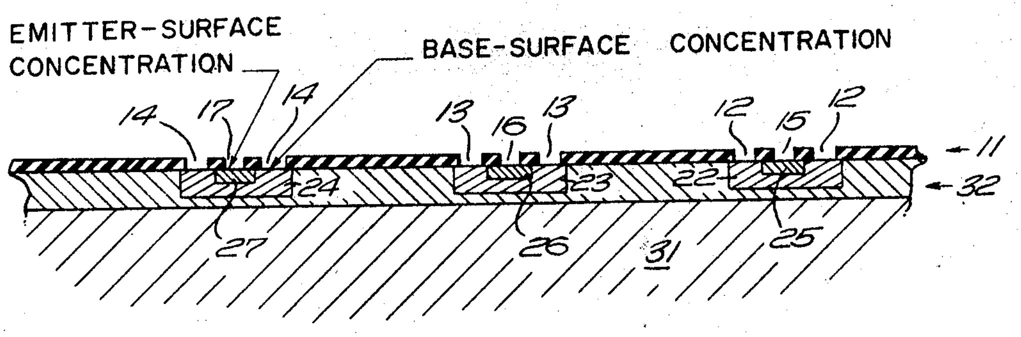
INVENTORS
DAVID H. NAVON
EDWIN S. DAVIS
BY
Wolf, Greenfield & Hieken
ATTORNEYS United States Patent Office 3,445,736

Patented May 20, 1969

3,445,736

SEMICONDUCTOR DEVICE DOPED WITH GOLD JUST TO THE POINT OF NO EXCESS AND METHOD OF MAKING

David H. Navon, Lincoln, and Edwin S. Davis, Danvers, Mass., assignors to Transitron Electronic Corporation, Wakefield, Mass., a corporation of Delaware Filed Oct. 24, 1966, Ser. No. 589,040

Int. Cl. H01l 11/00, 15/00, 7/00

U.S. Cl. 317—235 9 Claims

ABSTRACT OF THE DISCLOSURE

A silicon semiconductor device is doped with gold just to the point of no excess to establish a predetermined collector-to-emitter offset voltage at zero collector current and predetermined base current. A silicon wafer having emitter, base and collector regions is annealed in an inert atmosphere, such as nitrogen or argon, or in oxygen, or in air for from 12 to 48 hours at a temperature of 400–600° C. in order to very sensitively adjust the donor content. The progress of the process is checked, typically at one hour intervals, by removing the wafer from the furnace and measuring the offset voltage until it corresponds to acceptable limits, typically 150 millivolts, this acceptable voltage indicating no excess of gold in the silicon.

The present invention relates in general to high frequency semiconductor switching devices and more particularly concerns a novel semiconductor device and the process of manufacture characterized by substantially optimally high switching speed, high breakdown voltage and low collector saturation voltage through donor adjustment after the device is already established.

According to the invention, there is a silicon semiconductor device wafer doped with an amount of gold just below that amount constituting an excess of gold, said amount corresponding to that intended to establish an excess of gold or a predetermined collector-to-emitter offset voltage at zero collector current.

According to the process of the invention a gold doped silicon semiconductor device is annealed, typically in an inert atmosphere or in oxygen at a temperature typically of 450 degrees C., until the offset voltage (collector-emitter voltage at zero collector current) is less than a predetermined value.

The impotrance of high breakdown voltage, low saturation voltage semiconductor devices in efficient power switching circuits is well recognized in the electrical arts. Manufacture of such devices includes concern with lifetime control; that is, the time a free electron may exist before recombination with a hole. It is a well known procedure to control lifetime by gold doping. Normally, the amount of gold introduced into a semiconductor, such as silicon, is controlled by adjusting the temperature at which the gold is diffused into the semiconductor material, the gold solubility being temperature dependent. The difficulty with the conventional techniques is that accurate control of the gold doping to obtain optimum device performance is difficult to obtain.

Accordingly, it is an important object of this invention to provide a gold-doped semiconductor device characterized by optimum high speed switching, high breakdown voltage and low saturation voltage.

It is another object of the invention to achieve the the preceding object with a process that insures optimum gold doping.

It is a further object of the invention to achieve the preceding objects with a procedure that is relatively easy to practice, even by relatively unskilled personnel.

Other objects, features and advantages of the invention will become apparent from the following specification when read in connection with the accompanying drawing, the single figure of which shows a sectional view through a portion of a high speed silicon planar transistor wafer doped according to the invention.

With reference now to the drawing, there is shown a sectional view through a high speed silicon planar transistor wafer which may comprise an oxide coating 11 with a number of base openings such as 12, 13, and 14 through which P-type material is diffused and a number of emitter openings, such as 15, 16, and 17 through which N+ material is diffused to form base regions such as 22, 23, and 24 and emitter regions such as 25, 26, and 27. There is a wide N+ collector region 31 separated from the base region by an N region 32. This wafer thus comprises a number of planar high frequency transistors.

According to the process of the invention this completed silicon wafer, previously having been made according to techniques known in the art, is annealed in an inert atmosphere, such as nitrogen or argon, or in oxygen, or in air for from 12 to 48 hours at a temperature of 400–600 degrees C. in order to very sensitively adjust the donor content, an exemplary temperature being 450 degrees. The progress of the process is checked, typically at one hour intervals, by removing the wafer from the furnace and measuring the transistor offset voltage. That is, the voltage between collector layer 31 and each emitter layer such as 25 is measured with a constant base current supplied, typically using tungsten probe contacts and high impedance measuring means such as an oscilloscope or vacuum tube voltmeter, for the measurement. One of the tungsten probe contacts may contact an emitter layer such as 25 through opening 15 while the other may be placed in contact with collector layer 31. A third probe, contacting an area such as 12, admits a given base current suitable for the measurement. A typical acceptable offset voltage is 150 millivolts. If the offset voltage is too high, the slice of silicon may be reintroduced into the furnace for a few more hours for further annealment. It has been discovered that further annealing introduces a cumulative effect so that the annealing may be stopped when an acceptable offset voltage is measured, this acceptable voltage indicating no excess of gold in the silicon.

In the absence of this procedure too much gold might be present, causing the transistors to have too high an offset voltage which leads to excessive collector saturation voltage and wasted power. If too little gold is introduced, the transistors switch too slowly. It would be possible to avoid the effects of too much gold by originally using high donor content (low resistivity) silicon. However, this would result in low collector breakdown voltage. By practicing the process according to the invention donor content can be very accurately adjusted, and devices are produced having optimum switching speed, high breakdown voltage and low collector saturation voltage.

The present invention takes advantage of a physical phenomenon described in Kaiser & Keck, 28, J. Appl. Phys. 882 (1957). The present invention is believed to involve adjusting the effect of excess gold, active in the semiconductor through either the inactivation of some gold traps or the accurate introduction of donors due to the formation of silicon-oxygen complexes described in the aforementioned publication. The oxygen used in this formation may be present in the silicon starting material or may be diffused therein.

In a typical device the emitter surface concentration is $10^{20}$–$10^{21}$ atoms/cm.$^3$, the base surface concentration is typically $10^{18}$–$2\times10^{19}$ atoms/cm.$^3$ and the resistivity of the N+ collector layer is 0.1–1 ohm-cm.

There has been described a novel semiconductor device characterized by optimized switching speed, high breakdown voltage and low collector saturation voltage and the novel process of its manufacture. An exemplary device made according to the invention has the following typical characteristics:

Maximum voltages and current:

- $V_{CEO}$—Collector to emitter voltage ..... volts .. 20
- $V_{CBO}$—Collector to base voltage ..... do .... 50
- $V_{EBO}$—Emitter to base voltage ..... do .... 4.5
- $I_C$—Collector current ..... ma .. 200

Maximum power dissipation:

- Dissipation at 25° C. ambient[1] ..... w .. 0.36
- Dissipation at 25° C. case[2] ..... w .. 1.2
- Device dissipation at 100° C. case ..... w .. 0.68

Maximum temperatures:

- Storage (non-operating) ..... ° C .. −65 to +300
- Operating junction ..... ° C .. 200

[1] Derate 2.06 mw./° C.
[2] Derate 6.85 mw./° C.

method includes the steps of annealing a gold doped silicon semiconductor device, measuring the collector-to-emitter offset voltage at zero collector current and said predetermined base current, and continuing said annealing step until the measured collector-to-emitter offset voltage is substantially said predetermined value.

4. A method in accordance with claim 3 wherein said annealing step is carried out at a temperature substantially within the range 400–600 degrees centigrade.

5. A method in accordance with claim 4 wherein said annealing step is carried out for from 12 to 48 hours.

6. A method in accordance with claim 5 wherein said annealing step is carried out in one of an inert atmosphere, an oxygen atmosphere and an air atmosphere.

7. A method in accordance with claim 6 wherein the progress of said process is checked by removing said wafer from said atmosphere, applying emitter, base and collector probe contacts to said emitter, base and collector regions respectively, supplying a constant base current to said base region through means including said base contact, and measuring the potential between said emitter and collector probe contacts with a high impedance measuring means.

8. A method in accordance with claim 7 and further wherein the steps of claim 7 are repeated at substantially hourly intervals until the measured collector-to-emitter offset voltage is less than said predetermined value.

9. A method in accordance with claim 3 wherein said predetermined value is substantially 150 millivolts.

| Parameter | Min. | Max. | Units | Test Conditions |
|---|---|---|---|---|
| $h_{FE}$—DC current gain | 50 | 150 | ------- | $V_{CE}$=1 V., $I_C$=10 ma., (Note 1). |
| Do | 20 | ------- | ------- | $V_{CE}$=1 V., $I_C$=10 ma., $T_A$=−55° C.[1] |
| Do | 20 | ------- | ------- | $V_{CE}$=4 V., $I_C$=200 ma.[1] |
| $I_B$—Base reverse current | | 0.4 | μa. | $V_{CE}$=16 V., $V_{EB}$=0 V. |
| $I_{CES}$—Collector reverse current | | 0.4 | μa. | $V_{CE}$=16 V., $V_{EB}$=0 V. |
| $I_{CBO}$—Collector cutoff current | | 0.05 | μa. | $V_{CB}$=20 V. |
| Do | | 30 | μa. | $V_{CB}$=20 V., $T_A$=150° C. |
| $BV_{CBO}$—Collector-base breakdown voltage | 50 | ------- | V. | $I_E$=0, $I_C$=10 μa. |
| $BV_{CES}$—Collector-emitter breakdown voltage | 40 | ------- | V. | $I_C$=10 μa. |
| $BV_{EBO}$—Emitter-base breakdown voltage | 4.5 | ------- | V. | $I_C$=0, $I_E$=10 μa. |
| $BV_{CEO}$—Collector-emitter breakdown voltage | 20 | ------- | V. | $I_C$=10 ma.[1] |
| $V_{CE}$ (sat)—Collector-emitter saturation voltage | | 0.25 | V. | $I_C$=10 ma., $I_B$=1 ma. |
| Do | | 0.70 | V. | $I_C$=200 ma., $I_B$=20 ma. |
| $V_{BE}$ (sat)—Base-emitter saturation voltage | 0.70 | 0.85 | V. | $I_C$=10 ma., $I_B$=1 ma. |
| Do | | 1.2 | V. | $I_C$=200 ma., $I_B$=20 ma. |
| $C_{ob}$—Output capacitance | | 4 | Pf. | $V_{CB}$=5V., $I_C$=0, f.=1 mc. |
| $C_{ib}$—Input capacitance | | 8 | Pf. | $V_{EB}$=0.5 V., $I_E$=0, f.=1 mc. |
| $h_{fi}$—Small signal current gain | 6 | ------- | ------- | $I_C$=10 ma., $V_{CE}$=10 V., f.=100 mc. |
| $t_{on}$—Turn on time | | 16 | Nsec. | $V_{CC}$=3V., $I_{CS}$=10 ma., $I_{B1}$=3 ma., $I_{B2}$=−1.5 ma. |
| Do | | 40 | Nsec. | $V_{CC}$=5V., $I_{CS}$=200 ma., $I_{B1}$=20 ma., $I_{B2}$=−20 ma. |
| $t_s$—Charge storage time | | 10 | Nsec. | $V_{CC}$=10V., $I_{CS}$=10 ma., $I_{B1}$=10 ma., $I_{B2}$=−10 ma. |
| Do | | 15 | Nsec. | $V_{CC}$=10V., $I_{CS}$=20 ma., $I_{B1}$=20 ma., $I_{B2}$=−20 ma. |
| $t_{off}$—Turn off time | | 18 | Nsec. | $V_{CC}$=3V., $I_{CS}$=10 ma., $I_{B1}$=3 ma., $I_{B2}$=−1.5 ma. |
| Do | | 30 | Nsec. | $V_{CC}$=5V., $I_{CS}$=200 ma., $I_{B1}$=20 ma., $I_{B2}$=−20 ma. |

[1] Derate 2.06 mw./° C.

Commercially available embodiments of devices according to the invention are Transitron type 2N2369 and type 2N3862 transistors.

It is apparent that those skilled in the art may now make numerous uses and modifications of and departures from the specific embodiment described herein without departing from the inventive concepts. Consequently, the invention is to be construed as embracing each and every novel feature and novel combination of features present in or possessed by the devices and techniques herein disclosed and limited solely by the spirit and scope of the appended claims.

What is claimed is:

1. A silicon semiconductor device wafer having means defining emitter, base and collector regions and doped with an amount of gold substantially at but just below that amount constituting an excess of gold, said amount of gold comprising means for establishing a predetermined collector-to-emitter offset voltage at zero collector current and predetermined base current.

2. A silicon semiconductor device wafer in accordance with claim 1 made by annealing a gold doped silicon semiconductor device until the collector-to-emitter offset voltage at zero collector current and said predetermined base current is substantially said predetermined value.

3. A method of making the device of claim 1 which

References Cited

UNITED STATES PATENTS

| | | | |
|---|---|---|---|
| 3,272,661 | 9/1966 | Tomono | 148—1.5 |
| 3,184,347 | 5/1965 | Hoerni | 148—33.3 |

JOHN W. HUCKERT, *Primary Examiner.*

M. EDLOW, *Assistant Examiner.*

U.S. Cl. X.R.

148—1.5